United States Patent
Jang et al.

(10) Patent No.: US 9,571,089 B2
(45) Date of Patent: Feb. 14, 2017

(54) BUILT-IN GATE DRIVER

(71) Applicant: LG DISPLAY CO., LTD., Seoul (KR)

(72) Inventors: Yong Ho Jang, Goyang-si (KR); Woo Seok Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 161 days.

(21) Appl. No.: 14/518,470

(22) Filed: Oct. 20, 2014

(65) Prior Publication Data

US 2015/0116008 A1    Apr. 30, 2015

(30) Foreign Application Priority Data

Oct. 29, 2013  (KR) .................. 10-2013-0128964

(51) Int. Cl.
    *H03K 3/00*  (2006.01)
    *H03K 17/16*  (2006.01)

(52) U.S. Cl.
    CPC .................. *H03K 17/161* (2013.01)

(58) Field of Classification Search
    CPC .................................... H03K 17/161
    See application file for complete search history.

(56) References Cited

U.S. PATENT DOCUMENTS

| | | | |
|---|---|---|---|
| 6,225,969 B1* | 5/2001 | Ishii | G09G 3/367 345/100 |
| 2006/0061535 A1 | 3/2006 | Kim et al. | |
| 2008/0079001 A1* | 4/2008 | Umezaki | H01L 27/12 257/59 |
| 2011/0089975 A1* | 4/2011 | Yamazaki | H01L 27/1225 326/102 |
| 2011/0221736 A1* | 9/2011 | Pak | G09G 3/3677 345/211 |
| 2012/0146978 A1* | 6/2012 | Park | G11C 19/287 345/211 |
| 2013/0100006 A1 | 4/2013 | Lin et al. | |
| 2014/0176525 A1* | 6/2014 | Woo | G09G 3/3233 345/212 |
| 2014/0210752 A1* | 7/2014 | Katsuta | G06F 3/0418 345/173 |

(Continued)

FOREIGN PATENT DOCUMENTS

| | | |
|---|---|---|
| CN | 1704804 A | 12/2005 |
| CN | 1753072 A | 3/2006 |

OTHER PUBLICATIONS

Office Action dated Jul. 20, 2016 for Chinese Application No. 201410593430.9, 7 pages.

*Primary Examiner* — Lincoln Donovan
*Assistant Examiner* — Khareem E Almo
(74) *Attorney, Agent, or Firm* — Brinks Gilson & Lione

(57) ABSTRACT

A built-in gate driver includes a shift register provided in a non-display area of a panel, and configured to include first to gth stages outputting a scan signal, a clock supply line part configured to include m number of clock supply lines connected to the shift register, and a power supply line part configured to include n number of power supply lines connected to the shift register. At least one of the lines of the clock supply lines and the power supply lines are in a first side direction of the shift register, and the other at least one or more lines of the clock supply lines and the power supply lines are in a second side direction of the shift register.

10 Claims, 13 Drawing Sheets

(56) References Cited

U.S. PATENT DOCUMENTS

| | | | |
|---|---|---|---|
| 2015/0116008 A1* | 4/2015 | Jang | H03K 17/161 327/109 |
| 2016/0125955 A1* | 5/2016 | Pang | G11C 19/287 377/64 |
| 2016/0148556 A1* | 5/2016 | Tseng | G09G 3/2092 345/55 |

* cited by examiner

BUILT-IN GATE DRIVER

CROSS-REFERENCE TO RELATED APPLICATIONS

This application claims the benefit of priority to Korean Patent Application No. 10-2013-0128964 filed on Oct. 29, 2013, which is hereby incorporated by reference as if fully set forth herein.

BACKGROUND

Field of the Disclosure

The present disclosure relates to a built-in gate driver applied to a flat panel display device, and more particularly, to a built-in gate driver, which is provided in a panel configuring a flat panel display device.

Related Art

Flat Panel Display (FPD) devices are used in various electronic products such as portable phones, tablet PCs, notebooks, etc. The FPD devices include Liquid crystal Display (LCD) device, Plasma Display panels (PDPs), and Organic Light Emitting Display (OLED) Device, etc. Recently, Electrophoretic display (EPD) devices are being widely used as the FPD devices.

A FPD device includes a gate driver that sequentially supplies a pull-up signal to a plurality of gate lines.

The gate driver is configured as an integrated circuit (IC), and mounted on a panel of the FPD device. Recently, a gate-in panel (GIP) type gate driver in which a thin film transistor (TFT) and various elements configuring the gate driver are provided in the panel is widely used. Hereinafter, the GIP type gate driver is simply referred to as a built-in gate driver.

FIG. 1 is an exemplary diagram illustrating a configuration of a related art integrated gate driver, and FIG. 2 is an exemplary diagram illustrating an arrangement structure of lines applied to the related art integrated gate driver.

The related art integrated gate driver, as illustrated in FIG. 1, includes a shift register S that sequentially outputs a pull-up signal to a plurality of gate lines, a clock supply line part CLP for supplying various clocks to the shift register S, and a power supply line part PLP for supplying various powers to the shift register S.

The clock supply line part CLP includes at least two or more clock supply lines, and clocks having different periods or pulse widths are transferred through the clock supply lines.

The power supply line part PLP includes at least two or more power supply lines, and powers having the same voltage or different voltages are supplied through the power supply lines.

The shift register S includes a plurality of stages ST1 to STg including a plurality of transistors. The stages ST1 to STg are dependently connected to each other, and respectively output scan signals SS1 to SSg to the gate lines.

Each of the stages ST1 to STg applied to the shift register S configuring the built-in gate driver includes a pull-up transistor PU, which outputs the pull-up signal for turning on a switching transistor formed in each pixel of the panel, and a pull-down transistor PD that outputs a pull-down signal for turning off the switching transistor.

Each of the scan signals SS1 to SSg includes the pull-up signal for turning on the switching transistor and a pull-down signal for turning off the switching transistor.

The pull-up signal is output during one horizontal period, in which a data voltage is applied to the panel, in a partial section of one vertical period, and the pull-down signal is transferred to the gate line in the other section of the one vertical period.

In the related art integrated gate driver, as illustrated in FIG. 1, the clock supply lines configuring the clock supply line part CLP and the power supply lines configuring the power supply line part PLP are formed at one side of the shift register S. Hereinafter, for convenience of description, as illustrated in FIGS. 1 and 2, a case in which the built-in gate driver includes four clock supply lines CL1 to CL4 and n number of power supply lines PL1 to PLn will be described as an example of the related art integrated gate driver. In this case, first to fourth clocks CLK1 to CLK4 are respectively supplied through first to fourth clock supply lines CL1 to CL4, and first power to nth power Power1 to Power4 are respectively supplied through first to nth power supply lines PL1 to PLn.

Moreover, generally, the clock supply lines, the power supply lines, and the stages ST1 to STg long extend in an up and down direction of the panel.

In this case, delay of the pull-up signal output from the stages disposed at a lower end of the panel progressively increases in a direction from a g-3rd stage ST(g-3) to a gth stage STg.

The delay is caused by resistances of the clock supply lines and power supply lines themselves, or as illustrated in FIG. 2, the delay is caused by a parasitic capacitance which is generated at each of positions in which the clock supply lines CL1 to CL4 overlap the power supply lines PL1 to PLn.

For example, the first clock supply line CL1 of FIG. 2 overlaps the second to fourth clock supply lines CL2 to CIA and the first to nth power supply lines PL1 to PLn while a clock is being transferred to the shift register S. In this case, a parasitic capacitance is generated in an overlapping area, and the first clock CLK1 is delayed by the parasitic capacitance while the first clock CLK1 is being transferred to the stage. Due to the delay, the pull-up signal generated from the first clock is also delayed.

For the same reasons, the second to fourth clocks CLK2 to CLK4 are delayed, and due to the delay, pull-up signals respectively generated from the second to fourth clocks CLK2 to CLK4 are also delayed.

Delays of the pull-up signals, as described above, are caused by an overlap between the clock supply lines CL1 to CL4 and an overlap between the clock supply lines and the power supply lines, or are caused by a parasitic capacitance in the pull-up transistor included in each of the stages.

For example, a pull-up transistor for outputting the pull-up signal is formed in each of the stages, and a corresponding clock supply line or power supply line is connected to the pull-up transistor. That is, one of the clock supply lines is connected to a drain of the pull-up transistor, the gate line is connected to a source of the pull-up transistor, and a Q node of the stage is connected to a gate of the pull-up transistor.

In this case, a gate-drain parasitic capacitor Cgd is formed between the clock supply line and the Q node, and a gate-source parasitic capacitor Cgs is formed between the gate line and the Q node.

Delay of the pull-up signal is produced by the gate-drain parasitic capacitor Cgd.

In particular, when the shift register is configured with a coplanar-type transistor, an overlap of the clock line greatly affects the delay of the pull-up signal because the gate-drain parasitic capacitor Cgd is smaller than a different-type transistor.

SUMMARY

A built-in gate driver includes: a shift register provided in a non-display area of a panel, and configured to include first to gth stages outputting a scan signal; a clock supply line part configured to include m number of clock supply lines connected to the shift register; and a power supply line part configured to include n number of power supply lines connected to the shift register, wherein, at least one or more lines of the clock supply lines and the power supply lines are disposed in a first side direction of the shift register, and the other at least one or more lines of the clock supply lines and the power supply lines are disposed in a second side direction of the shift register.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE EXEMPLARY EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1:
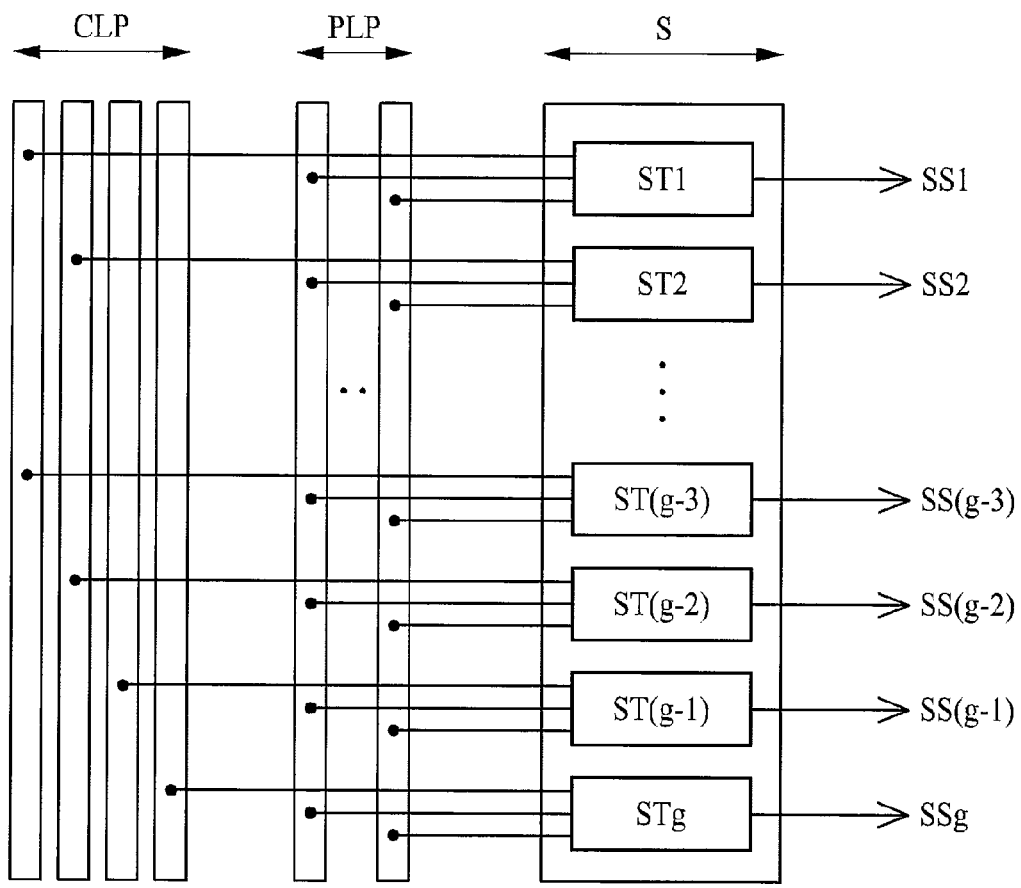
FIG. 1 is an exemplary diagram illustrating a configuration of a related art integrated gate driver.
Figure 2:
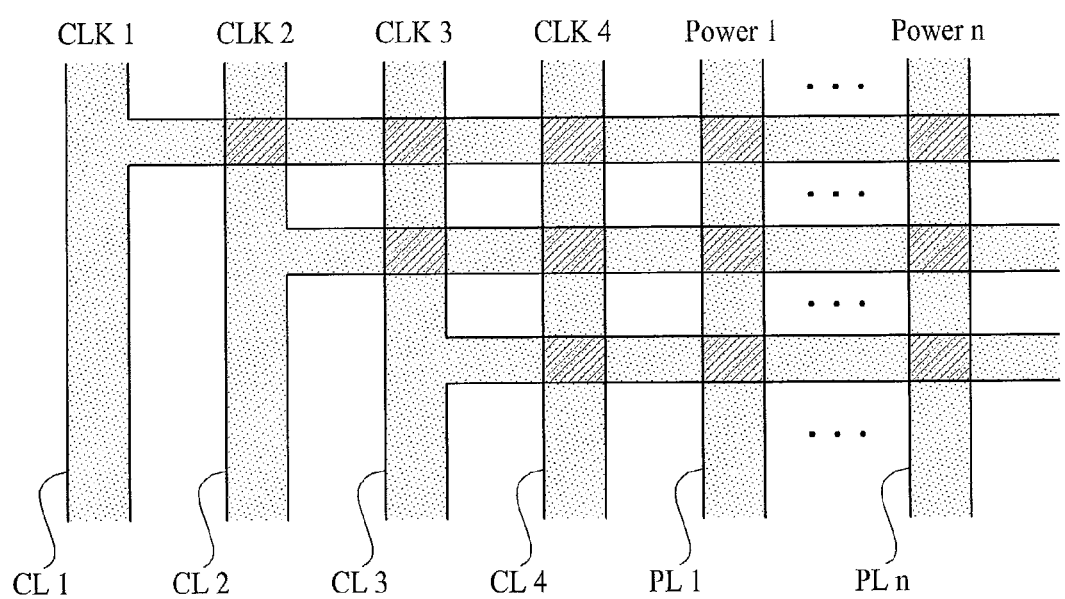
FIG. 2 is an exemplary diagram illustrating an arrangement structure of lines applied to the related art integrated gate driver.
Figure 3:
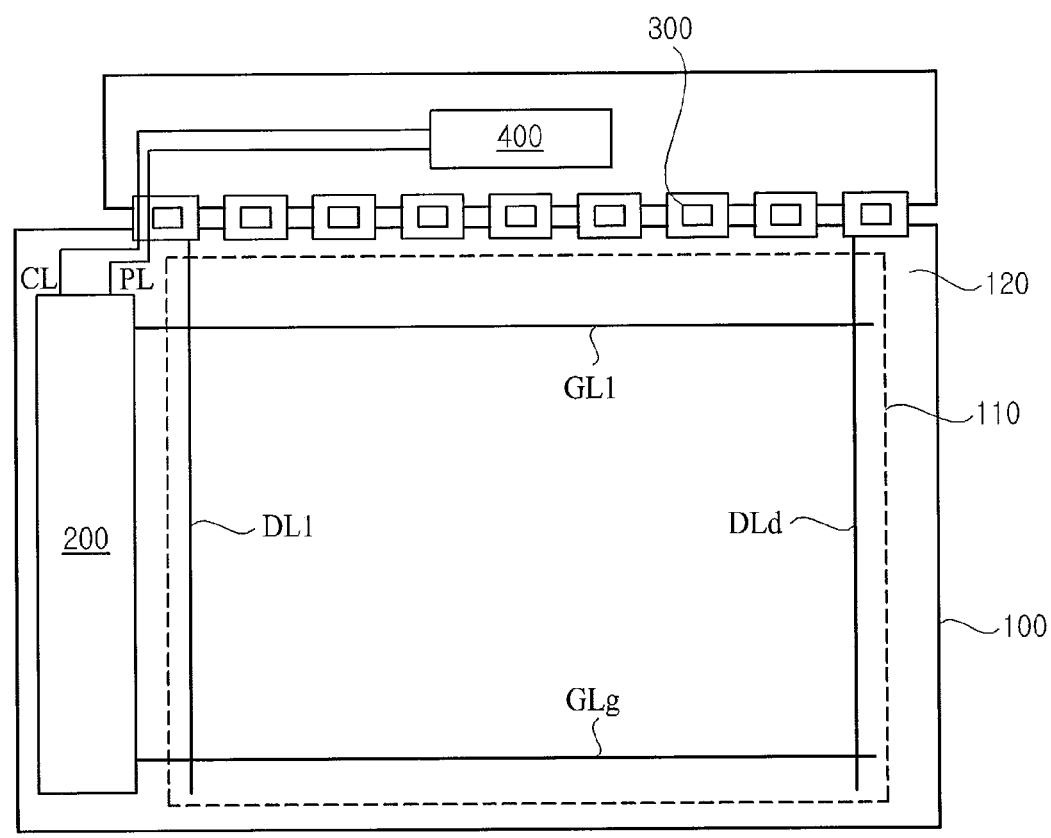
FIG. 3 is an exemplary diagram illustrating a configuration of an FPD device including a built-in gate driver according to an embodiment.

FIG. 3 is an exemplary diagram illustrating a configuration of an FPD device including a built-in gate driver according to an embodiment.

The FPD device according to an embodiment, as illustrated in FIG. 3, includes: a panel 100 in which a plurality of pixels are respectively formed in a plurality of intersection areas between a plurality of data lines DL1 to DLd and a plurality of gate lines GL1 to GLg; a data driver 300 that respectively supplies data voltages to the data lines DL1 to DLd; a timing controller 400 that drives the data driver 300; and a built-in gate driver 200 that is built into a non-display area 120 of the panel 100, and are driven by a plurality of clocks input from the timing controller 400 to sequentially supply a pull-up signal to the gate lines GL1 to GLg.

The panel 100 includes the plurality of pixels, which are respectively in a plurality of pixel areas defined by intersections between the gate lines GL1 to GLg and the data lines DL1 to DLd formed in a display area 110. The panel 100 may be a panel applied to an LCD device, an organic light emitting display device, or an EPD device. Also, the panel 100 may be a panel applied to various types of FPD devices driven by a pull-up signal, in addition to the above-described FPD devices.

The panel 100 includes first and second substrates, which are facing-coupled to each other.

The first substrate includes the display area 100, which includes the plurality of pixels respectively formed in the plurality of pixel areas defined by intersections between the gate lines GL1 to GLg and the data lines DL1 to DLd, and the non-display area 120, which is provided near the display area 110.

Each of the plurality of pixels displays an image according to the pull-up signal supplied from an adjacent gate line GL and a data voltage supplied from an adjacent data line DL.

Each of the pixels may include at least one TFT and at least one capacitor. Each pixel may be a liquid crystal pixel that controls a light transmittance of liquid crystal according to the data voltage to display an image, or may be an emission pixel that emits light in proportion to a current based on the data voltage to display an image. The pixel may be formed in various types depending on the kind of the panel 100, in addition to the liquid crystal pixel or the emission pixel.

The second substrate covers all portions except a portion of the non-display area 120 of the first substrate. When the pixel is the liquid crystal pixel, a color filter layer may be formed on the second substrate. When the pixel is the emission pixel, the second substrate may perform a function of an encapsulating substrate that seals the first substrate 110. The second substrate may also be formed in various types depending on the kind of the panel 100.

The TFT formed in the pixel is turned on by the pull-up signal supplied from the gate line, and supplies a data voltage, supplied from the data line, to a pixel electrode formed in the pixel, or emits light from an organic light emitting diode (OLED) formed in the pixel.

That is, the panel 100 displays an image according to the pull-up signal supplied through the gate line GL and the data voltage supplied through the data line DL, and may be provided in various types. Also, the FPD device according to an embodiment may be an LCD device, an organic light emitting display device, or an EPD device depending on the kind of the panel 100. Hereinafter, for convenience of description, a case in which the FPD device is the LCD device and the panel 100 is the liquid crystal panel will be described as an example of the present disclosure.

The data driver 300 converts digital image data, transferred from the timing controller 400, into data voltages, and supplies the data voltages for one horizontal line to the data lines at every one horizontal period in which the pull-up signal is supplied to the gate line.

The data driver 300, as illustrated in FIG. 3, may be a source driver IC which is connected to the panel 100 in a chip-on film (COF) or a tape carrier package (TCP) type. In this case, at least one or more the data drivers 300 may be connected to the panel 100.

Moreover, the at least one or more data drivers 300 which are each configured as the source driver IC may be directly disposed in the non-display area 120 of the panel 100.

The data driver 300 converts the image data into the data voltages by using gamma voltages supplied from a gamma voltage generator (not shown), and respectively outputs the data voltages to the data lines. To this end, the data driver 300 includes a shift register, a latch, a digital-to-analog converter (DAC), and an output buffer.

The shift register outputs a sampling signal by using data control signals (SSC, SSP, etc.) received from the timing controller 400.

The latch latches the digital image data Data that are sequentially received from the timing controller 400, and simultaneously outputs the digital image data to the DAC.

The DAC simultaneously converts the image data Data, transferred from the latch, into positive or negative data voltages, and outputs the positive or negative data voltages. That is, the DAC converts the image data into the positive or negative data voltages according to a polarity control signal (POL) transferred from the timing controller 400, by using the gamma voltages supplied from the gamma voltage generator (not shown), and respectively outputs the positive or negative data voltages to the data lines.

The output buffer outputs the positive or negative data voltages, transferred from the DAC, to the data lines DL1 of the organic light emitting display panel 100 according to the source output enable signal (SOE) transferred from the timing controller 400.

The timing controller 400 generates a gate control signal GCS for controlling an operation timing of the built-in gate driver 200 and a data control signal DCS for controlling an operation timing of the data driver 300 by using a timing signal (i.e., a vertical sync signal (Vsync), a horizontal sync signal (Hsync), and a data enable signal (DE)) input from an external system (not shown), and generates image data which are to be transferred to the data driver 300.

To this end, the timing controller 400 includes a receiver that receives input video data and a plurality of timing signals from the external system, a control signal generator that generates various control signals, a data aligner that realigns the input image data and outputs the realigned image data, and an output unit that outputs the control signals and the image data.

That is, the timing controller 400 realigns the input video data received from the external system so as to match a structure and characteristic of the panel 100, and transfers the realigned image data to the data driver 300. Such a function may be performed by the data aligner.

The timing controller 400 generates the gate control signal GCS for controlling the built-in gate driver 200 and the data control signal DCS for controlling the data driver 300 by using a plurality of the timing signals (i.e., the vertical sync signal (Vsync), the horizontal sync signal (Hsync), and the data enable signal (DE)) transferred from the external system, and transfers the controls to the data driver 300 and the built-in gate driver 200. Such a function may be performed by the control signal generator.

A plurality of the gate control signals GCS generated by the control signal generator include a gate output enable signal (GOE), a gate start signal (VST), and a clock signal (CLK).

A plurality of the data control signals generated by the control signal generator include a source start pulse (SSP), a source shift clock signal (SSC), a source output enable signal (SOE), and a polarity control signal (POL).

The built-in gate driver 200 is provided through the same process as a process of forming a plurality of pixel circuits in the display area. That is, a TFT and various elements configuring the gate driver 200 are formed along with the TFT and various elements in a process of manufacturing a TFT and various elements configuring each of the pixel circuits.

The built-in gate driver 200 sequentially supplies the pull-up signal to the gate lines GL1 to GLg by using the gate control signals GCS supplied from the timing controller 400.

The gate control signal GCS may include at least two or more clocks (CLK) and at least two more powers.

The pull-up signal denotes a voltage that turns on a switching TFT connected to each of the gate lines. A voltage that turns off the switching TFT is referred to as a pull-down signal, and a generic name for the pull-up signal and the pull-down signal is a scan signal.

When the TFT is an N-type TFT, the pull-up signal is a high-level voltage, and the pull-down signal is a low-level voltage. When the TFT is a P-type TFT, the pull-up signal is a low-level voltage, and the pull-down signal is a high-level voltage.

The built-in gate driver 200 sequentially outputs the pull-up signal to the gate lines by using the clocks and the powers supplied from the timing controller 400.

To this end, the built-in gate driver 200 includes a shift register that sequentially outputs the pull-up signal to a plurality of gate lines, a clock supply line part for supplying various clocks to the shift register, and a power supply line part for supplying various powers to the shift register.

The power supply line part includes at least two or more power supply lines, and powers having different voltages are supplied through the power supply lines.

The shift register includes a plurality of stages including a plurality of transistors. The stages are dependently connected to each other, and respectively output scan signals to the gate lines.

A schematic configuration of the shift register configuring the built-in gate driver 200 will be described below with reference to FIG. 4, a detailed configuration of the shift register will be described below with reference to FIG. 5, and a built-in gate driver according to a first embodiment of the present invention will be described below in detail with reference to FIG. 6.

Figure 4:
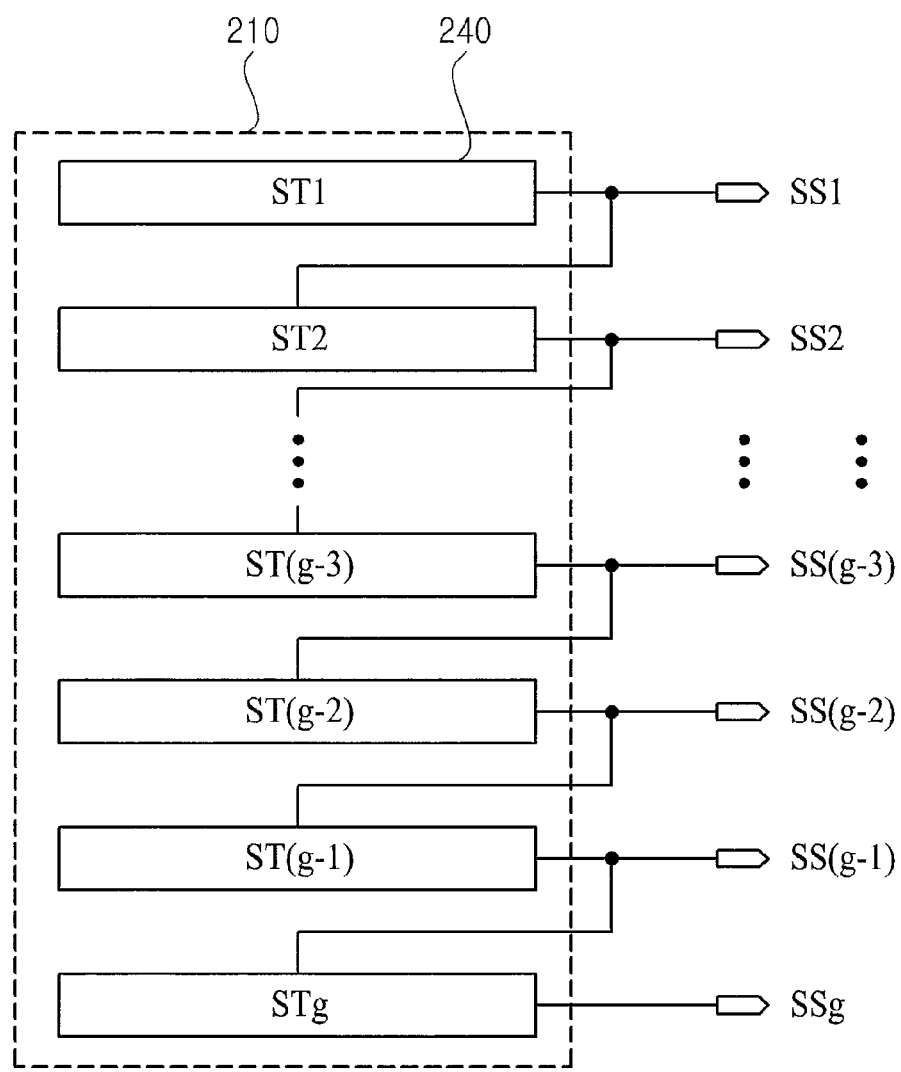
FIG. 4 is an exemplary diagram schematically illustrating a shift register applied to the built-in gate driver according to an embodiment.
Figure 5:
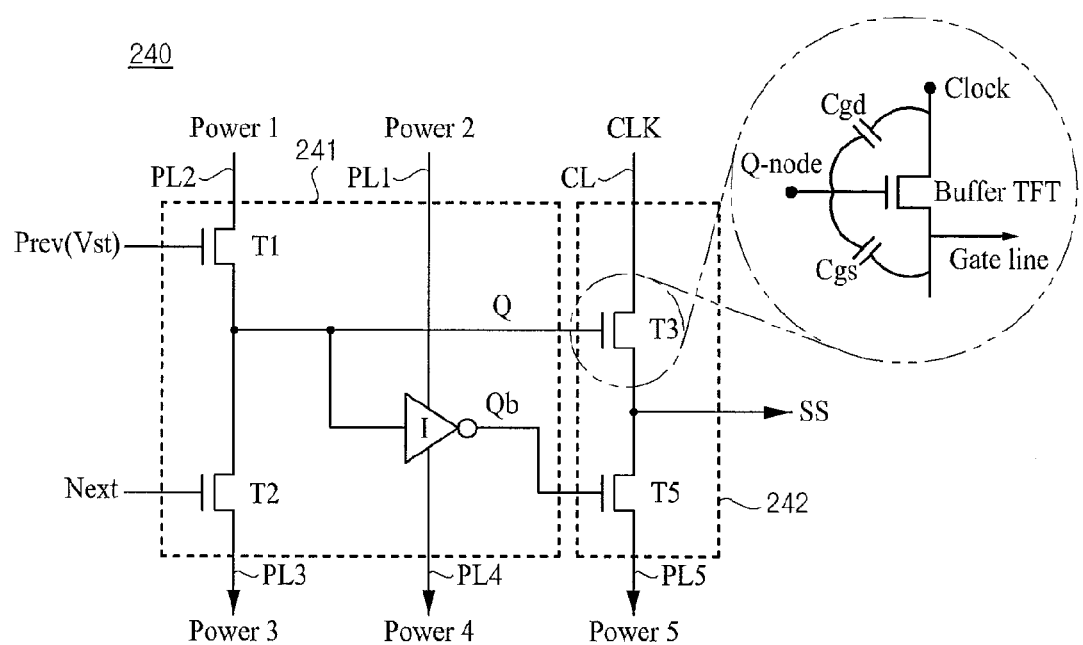
FIG. 5 is a circuit diagram of the shift register applied to the built-in gate driver according to an embodiment.

FIG. 4 is an exemplary diagram schematically illustrating a shift register applied to the built-in gate driver according to an embodiment, and FIG. 5 is a circuit diagram of the shift register applied to the built-in gate driver according to an embodiment.

As described above, the built-in gate driver according to an embodiment of the present invention includes a shift register 210 that sequentially outputs the pull-up signal to a plurality of gate lines, a clock supply line part for supplying various clocks to the shift register 210, and a power supply line part for supplying various powers to the shift register 210.

The clock supply line part includes at least two or more clock supply lines CL, and clocks having different periods or pulse widths are transferred through the clock supply lines CL.

The power supply line part includes at least two or more power supply lines PL1 to PL5, and powers having the same voltage or different voltages are supplied through the power supply lines PL1 to PL5.

The shift register 210 includes a plurality of stages ST1 to STg including a plurality of transistors. The stages ST1 to STg are dependently connected to each other, and respectively output scan signals SS1 to SSg to the gate lines.

Each of the stages ST1 to STg applied to the shift register 210, as illustrated in FIG. 5, includes a pull-up transistor T3, which outputs the pull-up signal for turning on a switching transistor formed in each pixel of the panel, and a pull-down transistor T5 that outputs a pull-down signal for turning off the switching transistor. The pull-up transistor T3 may be referred to as a buffer transistor (a buffer TFT).

One stage 240 is connected to one gate line. The number of the stages 240 may be variously set depending on a structure and size of the panel and the number of the gate lines. In FIG. 4, the shift register 210 applied to the panel 100 including g number of gate lines is illustrate as an example of the present invention. In this case, the g stages 240 configuring the shift register 210 are connected to g number of gate lines in one-to-one correspondence relationship.

However, one stage may be connected to at least two or more gate lines along one horizontal line. This will be described in detail with reference to FIGS. 9 to 11.

A basic operation of the shift register 210 according to an embodiment of the present invention will be described below by using the stage 240 of FIG. 5. In FIG. 5, among the stages 240 configuring the shift register 210, a first stage ST1 that receives a start signal from the timing controller 400 is illustrated. A configuration of each of the stages 240 configuring the shift register 210, illustrated in FIG. 4, is the same as the first stage ST1 of FIG. 5. In this case, the number of clocks input to each stage may be at least one or more, and the clocks are respectively supplied to the stages through at least two or more clock supply lines.

When a gate start signal Vst is input from the timing controller 400 to the first stage ST1, the first stage ST1 starts to drive. The first stage ST1 generates a first pull-up signal by suing a clock transferred from the timing controller 400 and the gate start signal Vst, outputs the first pull-up signal to a first gate line GL1, and transfers the first pull-up signal to a second stage ST2. The first pull-up signal is transferred to the second stage ST2. The first pull-up signal is output through the pull-up transistor T3. In this case, the first pull-up signal is output through the pull-down transistor T5. The first pull-up signal and the first pull-down signal are included in a first scan signal SS1.

The second stage ST2 starts to drive according to the first pull-up signal, and generates a second pull-up signal by using the clock CLK to output the second pull-up signal to a second gate line GL2.

The above-described operation is identically repeated in third to gth stages ST3 to STg.

That is, each of the stages outputs a scan signal SS to a corresponding gate line by using the clock CLK.

A detailed method of driving the stages may be variously performed depending on the number of the clocks input to the stages and a type of the clock.

Hereinabove, since the stage is schematically illustrated, only one clock has been described as being input to the stage, but the stage may be driven by at least two or more clocks. Also, the clocks input to the respective stages may have different periods and pulse widths.

The present invention is not limited to the configuration of the stage, and thus, a detailed description on the stage is not provided.

Figure 6:
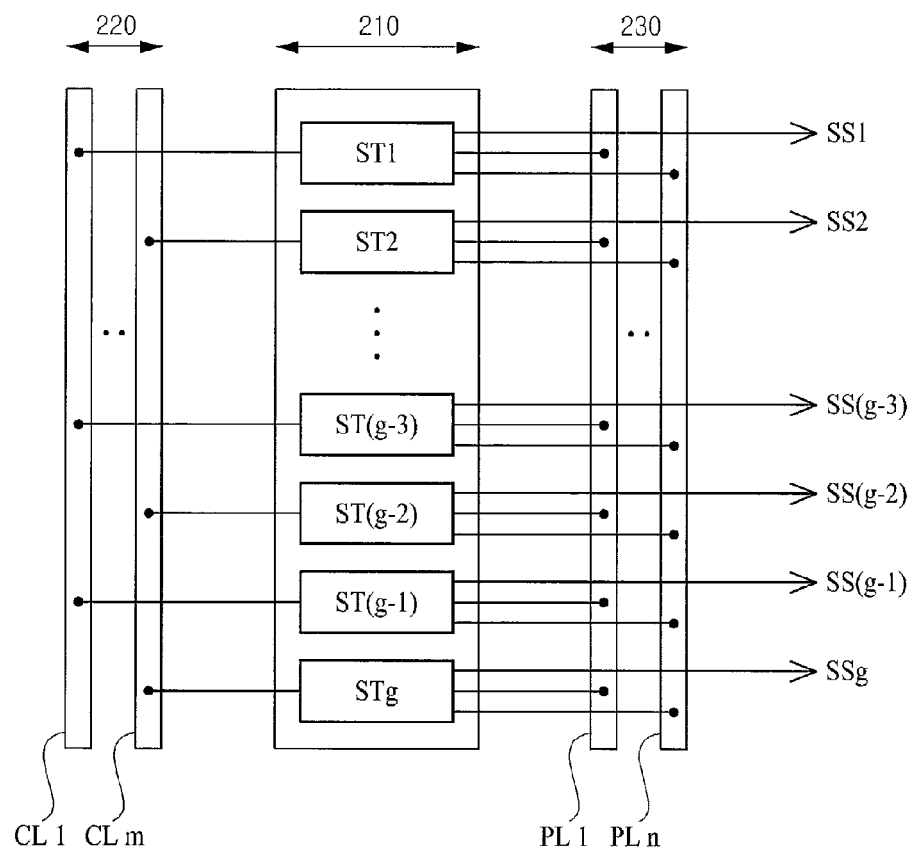
FIG. 6 is a configuration diagram of a built-in gate driver according to a first embodiment.

FIG. 6 is a configuration diagram of a built-in gate driver according to a first embodiment. Hereinafter, the built-in gate driver of FIG. 6 which includes the shift register 210 of FIG. 4 including the stages 240 of FIG. 5, a clock supply line part 220 including first to mth clock supply lines CL1 to CLm, and a power supply line part 230 including first to nth power supply lines PL1 to PLn will be described as an example of the present disclosure.

The built-in gate driver according to the first embodiment of the present invention includes the shift register 210 that includes the first to gth stages ST1 to STg outputting the scan signal and provided in the non-display area 120 of the panel 100, the clock supply line part 220 including m number of clock supply lines CL1 to CLm connected to the shift register 210, and the power supply line part 230 including n number of power supply lines PL1 to PLn connected to the shift register 210. Here, n and m are natural numbers more than two.

In the built-in gate driver according to the first embodiment of the present invention, at least one or more lines of the clock supply lines CL1 to CLm and the power supply lines PL1 to PLn are formed in a first side direction of the shift register 210. Also, the other at least one or more lines of the clock supply lines CL1 to CLm and the power supply lines PL1 to PLn are formed in a second side direction of the shift register 210. Here, when the first side is an outer direction of the panel, the second side may be adjacent to the display area of the panel. Also, when the first side is adjacent to the display area of the panel, the second side may be the outer direction of the panel.

Particularly, in the built-in gate driver according to the first embodiment of the present invention, as illustrated in FIG. 6, the clock supply lines CL1 to CLm may be formed in the first side direction of the shift register 210, and the first side direction may be the outer direction of the panel. In this case, the power supply lines PL1 to PLn may be formed in the second side direction of the shift register 210, and the second side direction may be adjacent to the display area of the panel.

The present invention enhances an output characteristic of the pull-up signal output from the stage. To this end, the clock supply lines CL1 to CLm and the power supply lines PL1 to PLn are respectively disposed at both sides of the shift register 210.

Therefore, an area in which one clock supply line overlap the other clock supply lines and the power supply lines is reduced, and thus, delay, which occurs in the clock supply line can be reduced.

For example, each of the clock supply lines includes a main line, which is formed along the outer direction of the panel, and a branch line that extends from the main line and is connected to the shift register. Each of the power supply lines includes a main line, which is formed along the outer direction of the panel, and a branch line that extends from the main line and is connected to the shift register.

In this case, the branch line configuring one clock supply line overlaps the main lines of the other clock supply lines and the main lines of the power supply lines, which are formed between the branch line of the one clock supply line and the shift register.

However, according to the present embodiment, the number of main lines overlapping a branch line can be reduced, and thus, the number of parasitic capacitors which are formed in an overlapping area can decrease. Accordingly, delay of the clock, which is supplied to the shift register through the branch line, can be reduced.

Since the delay of the clock which is supplied to the shift register through the clock supply line is reduced, delay of the pull-up signal which is output from the pull-up transistor formed in the stage can be reduced.

Since the delay of the pull-up signal is reduced, a performance of the built-in gate driver according to the first embodiment can be enhanced, and thus, a performance of an FPD device including the built-in gate driver according to the first embodiment can be enhanced.

Figure 7:
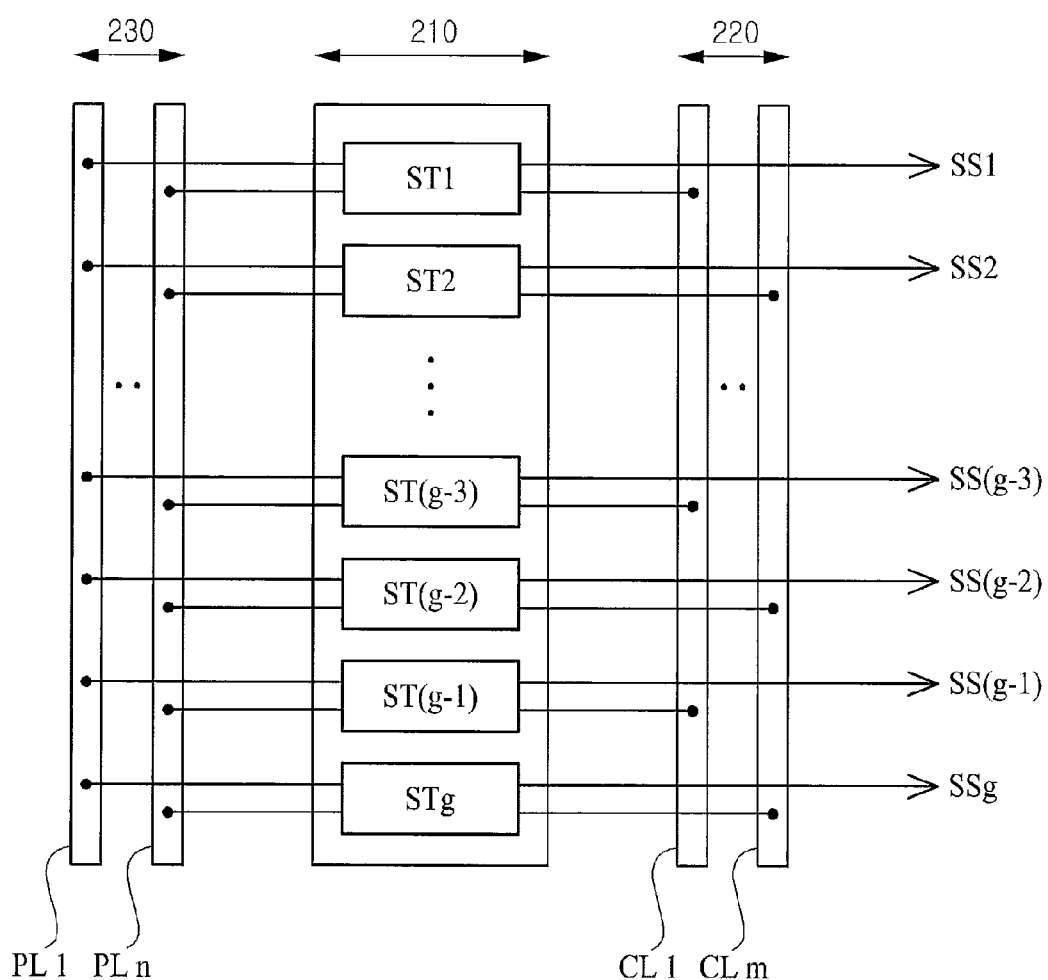
FIG. 7 is a configuration diagram of a built-in gate driver according to a second embodiment.

FIG. 7 is a configuration diagram of a built-in gate driver according to a second embodiment.

The built-in gate driver according to the second embodiment of the present invention, as described above, includes a shift register 210, a clock supply line part 220, and a power supply line part 230. At least one or more lines of the clock supply lines CL1 to CLm and the power supply lines PL1 to PLn are formed in a first side direction of the shift register 210, and the other at least one or more lines of the clock supply lines CL1 to CLm and the power supply lines PL1 to PLn are formed in a second side direction of the shift register 210.

Particularly, in the built-in gate driver according to the second embodiment as illustrated in FIG. 7, the power supply lines PL1 to PLn may be formed in the first side direction of the shift register 210, and the first side direction may be the outer direction of the panel.

Moreover, the clock supply lines CL1 to CLm may be formed in the second side direction of the shift register 210, and the second side direction may be adjacent to the display area of the panel.

To provide an additional description, in the built-in gate driver according to the first embodiment of the present invention illustrated in FIG. 6, all the clock supply lines CL1 to CLm may be formed in the first side direction, and all the power supply lines PL1 to PLn may be formed in the second side direction. However, in the built-in gate driver according to the second embodiment of the present invention illustrated in FIG. 7, all the clock supply lines CL1 to CLm may be formed in the second side direction, and all the power supply lines PL1 to PLn may be formed in the first side direction.

That is, the power supply lines and the clock supply lines may be formed as illustrated FIG. 6 or FIG. 7 depending on the panel or the FPD device.

Figure 8:
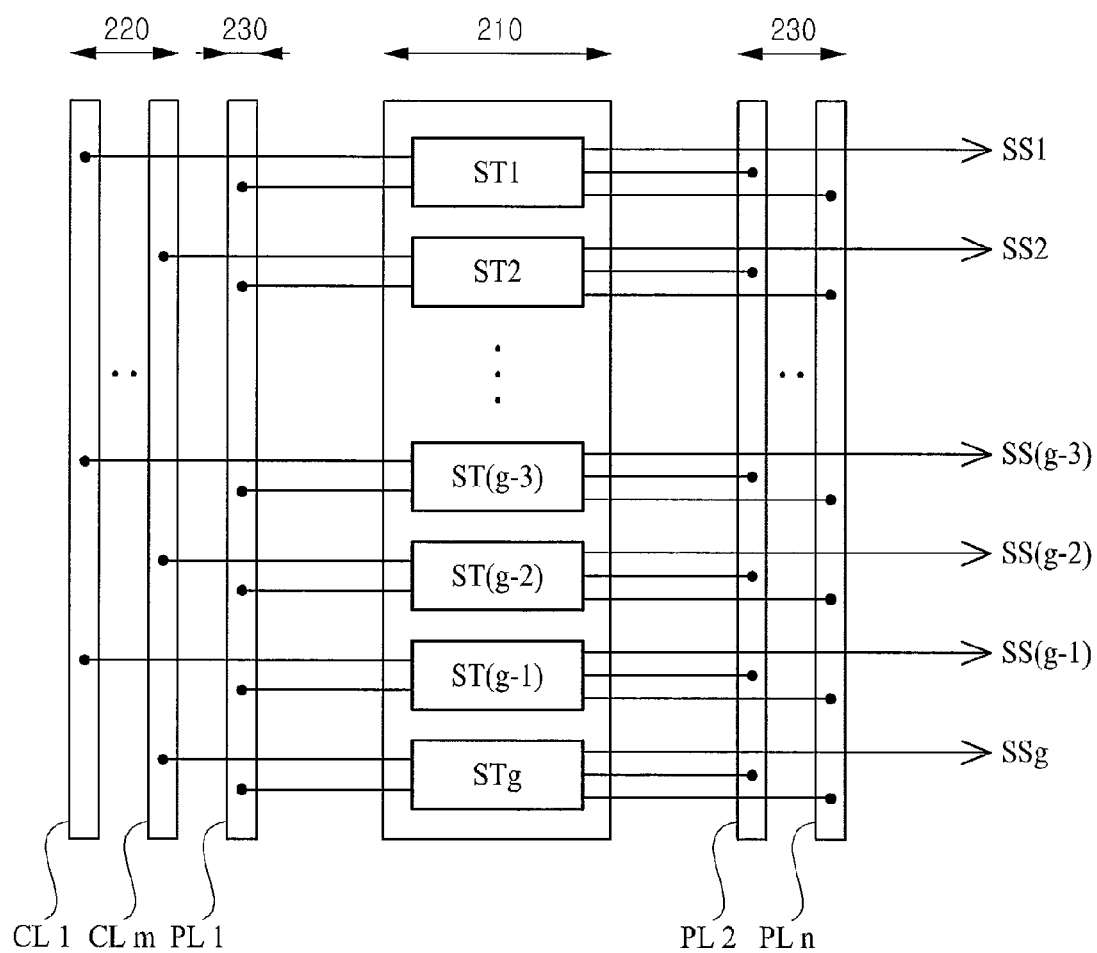
FIG. 8 is a configuration diagram of a built-in gate driver according to a third embodiment.

FIG. 8 is a configuration diagram of a built-in gate driver according to a third embodiment.

The built-in gate driver according to the third embodiment of the present invention, as described above, includes a shift register 210, a clock supply line part 220, and a power supply line part 230. At least one or more lines of the clock supply lines CL1 to CLm and the power supply lines PL1 to PLn are formed in a first side direction of the shift register 210, and the other at least one or more lines of the clock supply lines CL1 to CLm and the power supply lines PL1 to PLn are formed in a second side direction of the shift register 210.

Particularly, in the built-in gate driver according to the third embodiment of the present invention, as illustrated in FIG. 8, the m clock supply lines CL1 to CLm and at least one of the n power supply lines may be formed in the first side direction of the shift register 210, and the first side direction may be the outer direction of the panel.

In this case, among the n power supply lines, the power supply lines PL2 to PLn except the power supply line PL1 formed in the first side direction may be formed in the second side direction of the shift register 210, and the second side direction may be adjacent to the display area of the panel.

For example, in FIG. 8, the m clock supply lines CL1 to CLm and one power supply line PL1 are formed in the first side direction, and n−1 number of power supply lines PL2 to PLn are formed in the second side direction.

However, two or more power supply lines may be formed in the first side.

In another modification example of the built-in gate driver according to the third embodiment, the n power supply lines and at least one of the m clock supply lines CL1 to CLm may be formed in the second side direction of the shift register 210, and the second side direction may be adjacent to the display area of the panel.

In this case, among the m clock supply lines, the clock supply lines except the power supply line formed in the second side direction may be formed in the first side direction of the shift register 210, and the first side direction may be the outer direction of the panel.

That is, in the third embodiment of the present invention illustrated in FIG. 8, all the clock supply lines CL1 to CLm and one power supply line PL1 are formed in the first side direction, and n−1 number of power supply lines PL2 to PLn are formed in the second side direction.

However, in another example of the third embodiment, some of the clock supply lines may be formed in the first side direction, and the other clock supply lines and all the power supply lines may be formed in the second side direction.

Moreover, in another example of the third embodiment, all the clock supply lines and some of the clock supply lines may be formed in the first side direction, and the other clock supply lines may be formed in the second side direction.

According to the present embodiment, as described above, the branch line of the clock supply line decreases an area in which the main lines of the other clock supply lines overlap the main lines of the power supply lines, thereby preventing delay of a clock. To this end, therefore, the clock supply lines CL1 to CLm and the power supply lines PL1 to PLn may be divided into various numbers of lines, and formed with the shift register 210 therebetween.

Figure 9:
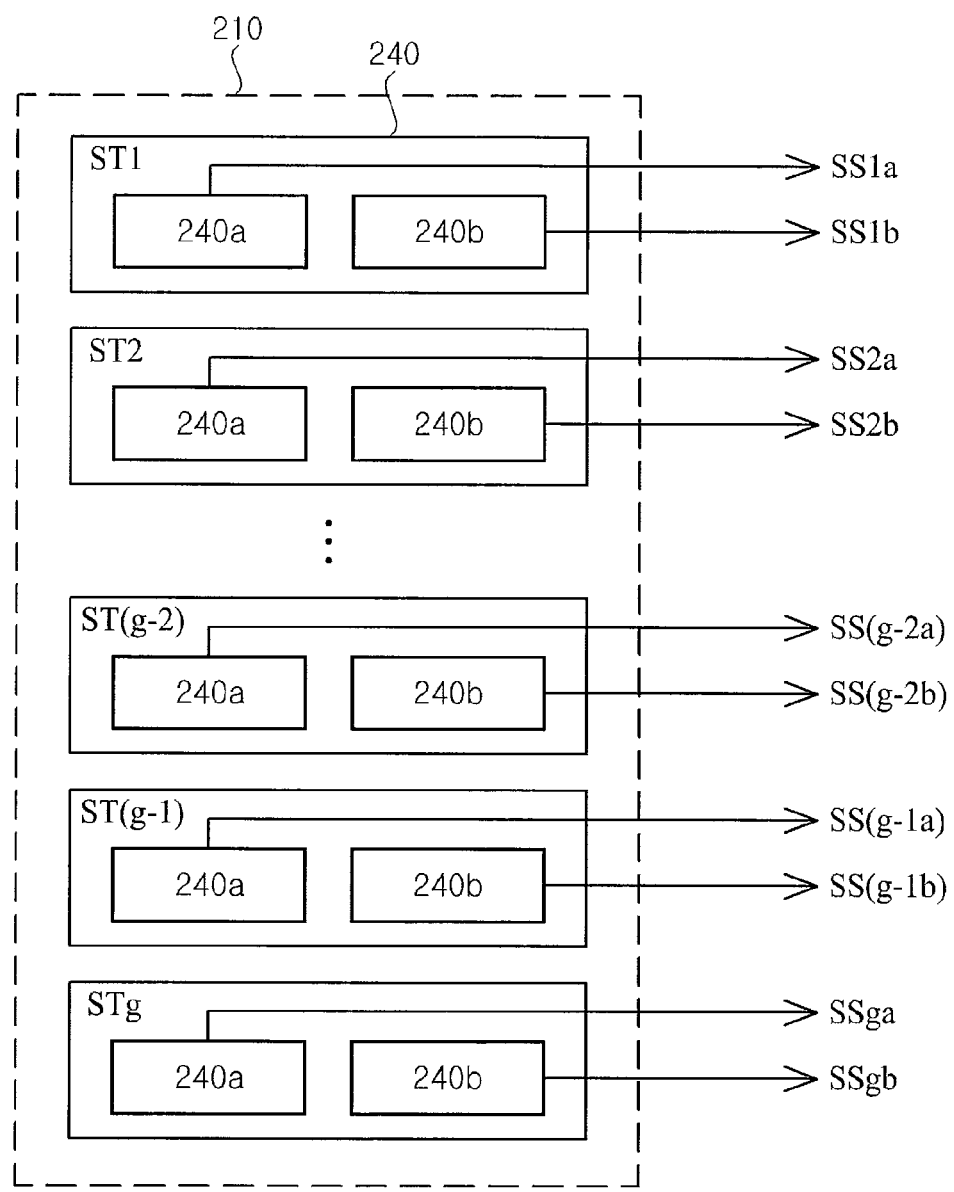
FIG. 9 is an exemplar diagram schematically illustrating another shift register applied to a built-in gate driver according to an embodiment.

FIG. 9 is an exemplar diagram schematically illustrating another shift register applied to a built-in gate driver according to an embodiment. In the following description, details which are the same as and similar to the details described above with reference to FIG. 4 are not described or will be briefly described.

As described above, the built-in gate driver according to an embodiment of the present invention includes the shift register 210 that sequentially outputs the pull-up signal to a plurality of gate lines, the clock supply line part 220 for supplying various clocks to the shift register 210, and the power supply line part 230 for supplying various powers to the shift register 210.

The clock supply line part 220 includes at least two or more clock supply lines CL1 to CLm, and clocks having different periods or pulse widths are transferred through the clock supply lines CL1 to CLm.

The power supply line part 230 includes at least two or more power supply lines PL1 to PLn, and powers having different voltages are supplied through the power supply lines PL1 to PLn.

The shift register 210 includes a plurality of stages ST1 to STg including a plurality of transistors. The stages ST1 to STg are dependently connected to each other, and respectively output scan signals SS1 to SSg to the gate lines.

Each of the stages ST1 to STg, as illustrated in FIG. 4, may be connected to one gate line which is formed on one horizontal line of the panel, but as illustrated in FIG. 9, each of the stages ST1 to STg may be connected to two gate lines which are formed on one horizontal line of the panel, or may be connected to three or more gate lines.

For example, as illustrated in FIG. 4, when one stage is connected to two gate lines, each of the stages may output two scan signals (i.e., odd scan signals SS1a to SSga and even scan signals SS1b to SSgb) through two gate lines.

In this case, each of the stages may include an odd scan signal output unit 240a, which outputs an odd scan signal (for example, SS1a), and an even scan signal output unit 240b that outputs an even scan signal (for example, SS1b).

The odd scan signal output unit 240a, as described above in the stage of FIG. 5, may be configured with a plurality of transistors, and may output the odd scan signal by using two or more clocks and two or more powers. Also, the even scan signal output unit 240b may be configured with a plurality of transistors, and may output the even scan signal by using two or more clocks and two or more powers.

To provide an additional description, each of the stages ST1 to STg may include at least two or more scan signal output units 240a and 240b. The scan signal output units 240a and 240b may be connected to two or more gate lines, which are formed on one horizontal line of the panel, and may output two or more scan signals SS1a and SS1b to the gate lines.

That is, the present invention is not limited to the odd scan signal output unit 240a, the even scan signal output unit 240b, and the configuration of the stage, and thus, detailed descriptions on the odd scan signal output unit 240a, the even scan signal output unit 240b, and the stage are not provided.

Figure 10:
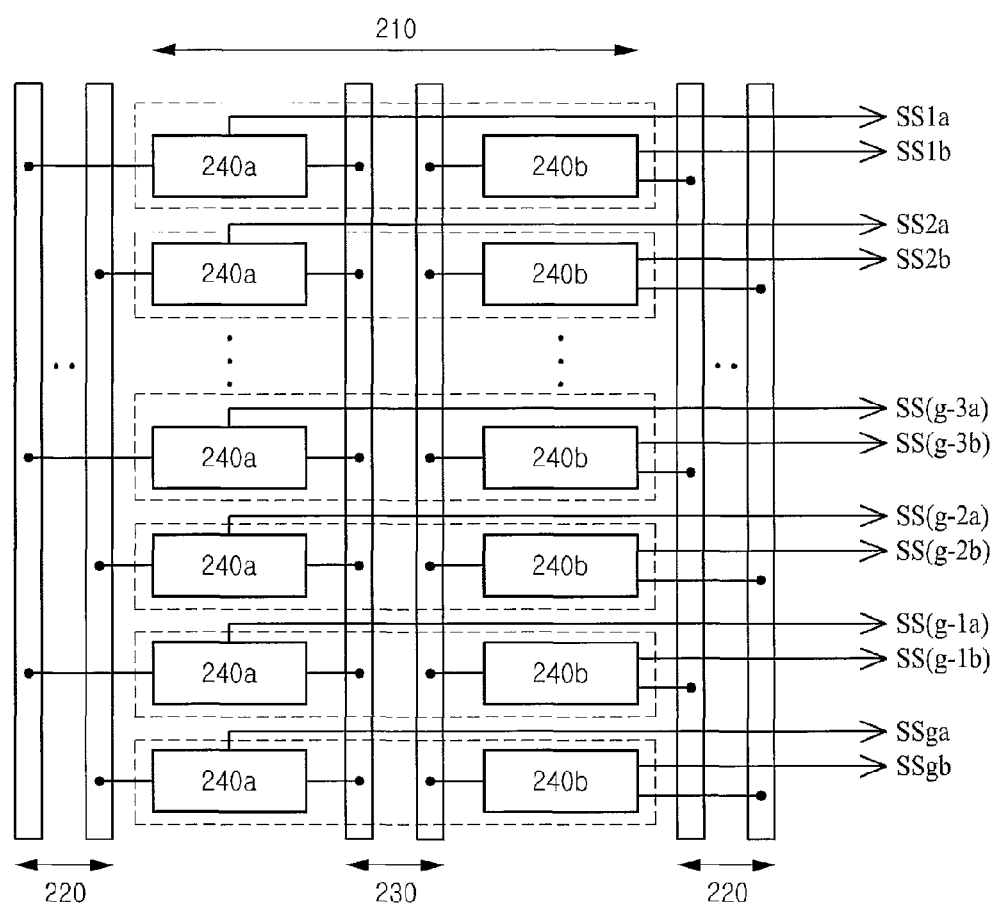
FIG. 10 is a configuration diagram of a built-in gate driver according to a fourth embodiment.
Figure 11:
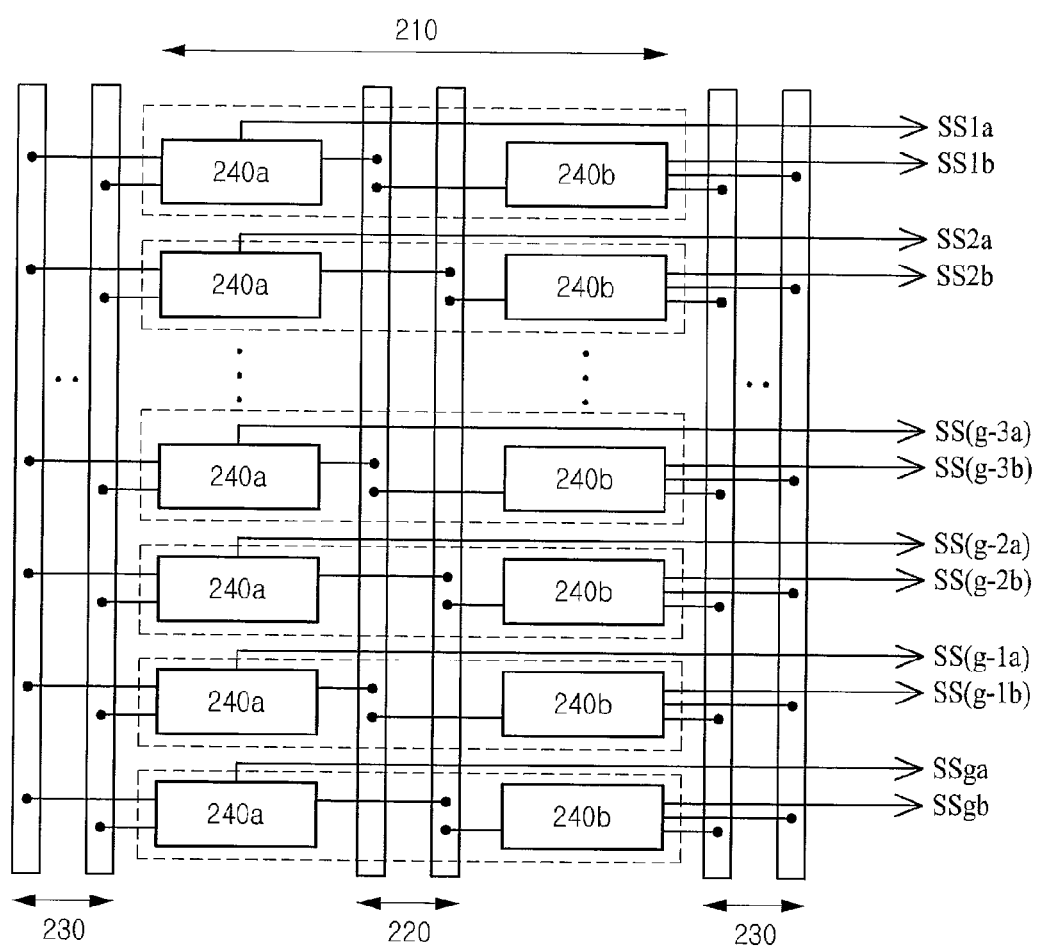
FIG. 11 is a configuration diagram of a built-in gate driver according to a fifth embodiment.

FIG. 10 is a configuration diagram of a built-in gate driver according to a fourth embodiment, and FIG. 11 is a configuration diagram of a built-in gate driver according to a fifth embodiment.

In the following descriptions on the fourth and fifth embodiments, the built-in gate driver of FIG. 10, which includes the shift register 210 of FIG. 9, a clock supply line part 220 including first to mth clock supply lines CL1 to CLm, and a power supply line part 230 including first to nth power supply lines PL1 to PLn, will be described as an example.

The built-in gate driver according to an embodiment, as described above, includes the shift register 210, the clock supply line part 220, and the power supply line part 230. At least one or more lines of the clock supply lines CL1 to CLm and the power supply lines PL1 to PLn are formed in a first side direction of the shift register 210, and the other at least one or more lines of the clock supply lines CL1 to CLm and the power supply lines PL1 to PLn are formed in a second side direction of the shift register 210.

Particularly, each of the stages 240 configuring the shift register 210 applied to the built-in gate driver according to the fourth embodiment may include at least two or more scan signal output units 240a and 240b. The scan signal output units 240a and 240b may be connected to two or more gate lines, which are formed on one horizontal line of the panel, and may output two or more scan signals SS1a and SS1b to the gate lines.

The clock supply line part 220 configured with the clock supply lines may be formed in the first and second side directions of the shift register 210. Here, the first side direction may be an outer direction of the panel, and the second side direction may be adjacent to the display area of the panel. In this case, the power supply line part 230 configured with the power supply lines may be formed between the scan signal output units 240a and 40b.

For example, when each of the stages 240 includes the two scan signal output units 240a and 240b and outputs the two scan signals SS1a and SS1b as illustrated in FIG. 10, the clock supply line part 220 configured with the clock supply lines may be formed in the first and second side directions, and the power supply line part 230 configured with the power supply lines may be formed between the two scan signal output units 240a and 240b.

Moreover, each of the stages 240 configuring the shift register 210 applied to the built-in gate driver according to the fifth embodiment may include at least two or more scan signal output units 240a and 240b. The scan signal output units 240a and 240b may be connected to two or more gate lines, which are formed on one horizontal line of the panel, and may output two or more scan signals SS1a and SS1b to the gate lines.

The power supply line part 230 configured with the power supply lines may be formed in the first and second side directions of the shift register 210. Here, the first side direction may be an outer direction of the panel, and the second side direction may be adjacent to the display area of the panel. In this case, the clock supply line part 220 configured with the clock supply lines may be formed between the scan signal output units 240a and 40b.

For example, when each of the stages 240 includes the two scan signal output units 240a and 240b and outputs the two scan signals SS1a and SS1b as illustrated in FIG. 11, the power supply line part 230 configured with the power supply lines may be formed in the first and second side directions, and the clock supply line part 220 configured with the clock supply lines may be formed between the two scan signal output units 240a and 240b.

As another example of the fifth embodiment, at least one or more of the clock supply lines and the power supply lines may be formed in the first and second side directions of the shift register 210 and between the two or more scan signal output units 240a and 240b.

For example, at least one or more clock supply lines may be formed in the first direction, at least one or more clock supply lines may be formed in the second direction, at least one or more clock supply lines may be formed between the scan signal output units 240a and 240b, and at least one or more power supply lines may be formed in the first side direct, the second side direction, and between the two or more scan signal output units 240a and 240b.

In addition to the above-described method, the clock supply lines and the power supply lines may be formed in various arrangement types.

To provide an additional description, as described above, the branch line of the clock supply line decreases an area in which the main lines of the other clock supply lines overlap the main lines of the power supply lines, thereby preventing delay of a clock. To this end, therefore, the clock supply lines CL1 to CLm and the power supply lines PL1 to PLn may be divided into various numbers of lines, and formed in the first side direct, the second side direction, and between the two or more scan signal output units 240*a* and 240*b*.

Figure 12:
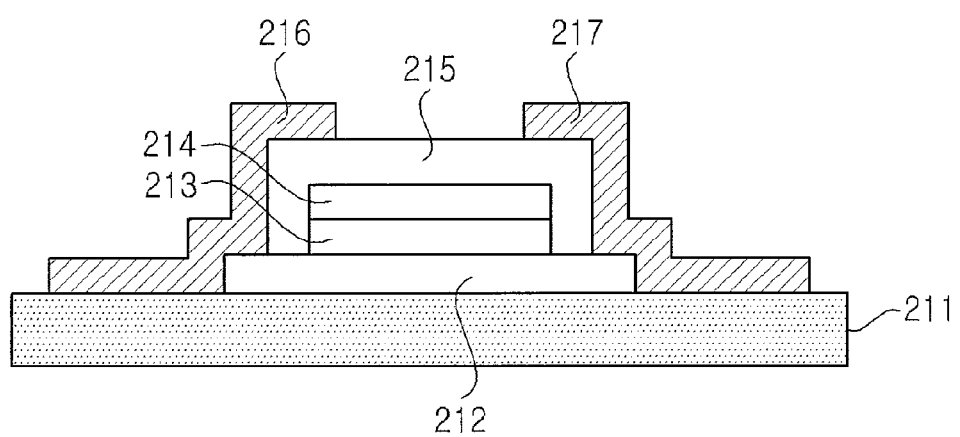
FIG. 12 is a configuration diagram of a clock supply line and a power supply line applied to a built-in gate driver according to an embodiment.

FIG. 12 is a configuration diagram of a clock supply line and a power supply line applied to a built-in gate driver according to an embodiment. FIG. 12 (*a*) is an exemplary diagram illustrating planes of the lines, and FIG. 12 (*b*) is an exemplary diagram illustrating cross-sectional surfaces of the lines.

Each of the clock supply lines CL1 to CLm configuring the clock supply line part 220, as illustrated in FIG. 12 (*a*), includes a main line 221, which is formed along the outer direction of the panel, and a branch line 222 that extends from the main line 221 and is connected to the shift register 210. Each of the power supply lines PL1 to PLn configuring the power supply line part 230 includes a main line 231, which is formed along the outer direction of the panel, and a branch line 232 that extends from the main line 231 and is connected to the shift register 210.

For example, when the main line 221 or 231 is formed on a base substrate 291 of the first substrate configuring the panel 100, the main lines are arranged at certain intervals, and the branch line 222 or 232 may be separated from the main line 221 or 231 with a first dielectric 292. The branch line 222 or 232 can be protected by a second dielectric 293.

The main line 221 or 231 and the branch line 222 or 232 may be formed in various types.

Here, the branch line 222 or 232 may be formed on the same layer as that of a gate electrode of a TFT configuring the stage 240, and may be formed on the same layer as that of a source electrode and drain electrode of the TFT.

As another example, the main line 221 or 231 may be formed on the same layer as that of the gate electrode of the TFT formed in the stage 240, and may be formed on the same layer as that of the source electrode and drain electrode of the TFT.

To provide an additional description, each of the clock supply lines and the power supply lines includes the main line 221 or 231, which is formed along the outer direction of the panel, and the branch line 222 or 232 which electrically connects the main line to the shift register 210. The branch lines may be formed on the same layer as that of the gate electrode of the TFT configuring the stage, and may be formed on the same layer as that of the source electrode and drain electrode of the TFT. The main line 221 or 231 and the branch line 222 or 232 may be formed on different layers.

Moreover, the branch line 222 of each clock supply line formed in the first side direction does not overlap the main line 221 or 231 of the clock supply line and the power supply line which are formed in the second side direction or between the output units. Also, the branch line 222 of each clock supply line formed in the second side direction does not overlap the main line 221 or 231 of the clock supply line and the power supply line which are formed in the first side direction or between the output units. Also, the branch line 222 of each clock supply line formed between the output units does not overlap the main line 221 or 231 of the clock supply line and the power supply line which are formed in the first side direction and in the second side direction.

Figure 13:
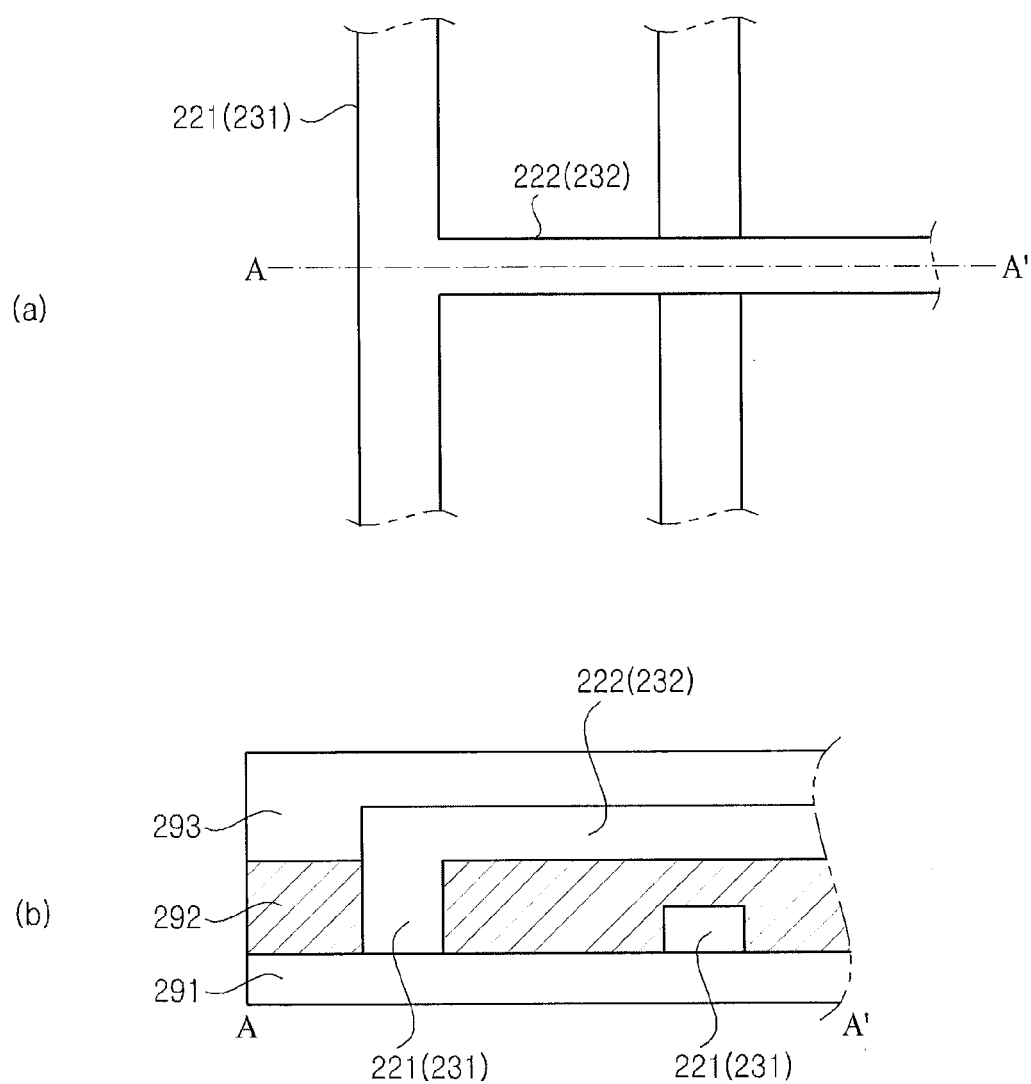
FIG. 13 is an exemplary diagram illustrating a cross-sectional surface of a TFT applied to a built-in gate driver according to an embodiment.

FIG. 13 is an exemplary diagram illustrating a cross-sectional surface of a TFT applied to a built-in gate driver according to an embodiment. In particular, FIG. 13 is an exemplary diagram illustrating a coplanar-type TFT.

A plurality of TFTs, which includes the pull-up transistor T3 and the pull-down transistor T5, are formed in the stage 240.

Generally, each of the TFTs includes a gate electrode formed on a substrate, a gate insulating layer covering the gate electrode, a semiconductor layer formed on the gate insulating layer, and a source electrode and a drain electrode which are formed on the semiconductor layer. That is, in a general TFT, the gate electrode is formed at a lowermost end of the substrate.

However, recently, as illustrated in FIG. 13, a coplanar-type TFT in which a semiconductor layer 212 is formed on a base substrate 211 or a buffer layer (not shown) formed on a base substrate and a gate electrode 214 is formed on the semiconductor layer 212 is widely used.

For example, the coplanar-type TFT may include the semiconductor layer 212 formed on the base substrate 211, a gate insulating layer 213 formed on the semiconductor layer 212, the gate electrode 214 formed on the gate insulating layer 213, a protective layer 215 covering the gate electrode 214, a source electrode 216 formed on the semiconductor layer 212 and the protective layer 215, and a drain electrode 217 formed on the semiconductor layer 212 and the protective layer 215.

That is, in the coplanar-type TFT, the semiconductor layer 212, the gate electrode 214, the protective layer (a dielectric layer) 215, the source electrode 216, and the drain electrode 217 are sequentially formed, and the source electrode 216 is electrically connected to the drain electrode 217 through a portion of the semiconductor layer 212 from which the protective layer 215 is removed.

Here, the TFT may be formed of oxide.

As described above, in the coplanar-type TFT formed of oxide, the number of gate-drain parasitic capacitors (Cgd) is reduced, and thus, a parasitic capacitor caused by an overlap of the clock supply line is a main cause of delay of the pull-up signal.

That is, since the number of the gate-drain parasitic capacitors (Cgd) is reduced, the parasitic capacitor caused by the overlap of the clock supply line is the main cause of the delay of the pull-up signal.

Therefore, when the coplanar-type TFT illustrated in FIG. 13 is formed in the stage 240 applied to the gate driver described above with reference to FIGS. 3 to 11, an effect of the present disclosure can be maximized.

The present disclosure will be additionally described below.

First, when the TFT formed in the stage is formed in a coplanar type and is formed of oxide, the present disclosure can be effectively used.

Second, according to embodiments of the present invention, the main line 221 or 231 may be bonded to the branch line 222 or 232 in a direct type, or the main line 221 or 231 may be bonded to the branch line 222 or 232 by using third metal. For example, the direct type is illustrated in FIG. 12 (*b*). However, an insulator may be deposited on the branch line, third metal may be deposited on the insulator, and the main line may be electrically connected to the branch line by the third metal.

Third, according to embodiments, since a circuit is configured by reducing the number of clocks, an area of the circuit can be reduced, and the number of overlaps between lines is reduced. Accordingly, an error rate can be reduced.

That is, the present invention can be effectively applied to organic light emitting display devices in which a plurality of outputs are needed, a number of clocks and powers are necessary, and the coplanar-type TFT formed of oxide is used.

According to the embodiments of the present invention, a load of the clock supply line is reduced, and thus, a characteristic of the shift register can be enhanced. Accordingly, delay of the pull-up signal can decrease.

That is, according to the embodiments, an overlap between the clock supply lines and an overlap between the clock supply lines and the power supply lines are reduced, and thus, an error rate of the built-in gate driver can be reduced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A built-in gate driver comprising:
   a shift register provided in a non-display area of a panel, and including first to gth stages outputting a scan signal;
   a clock supply line part including m number of clock supply lines connected to the shift register; and
   a power supply line part configured including n number of power supply lines connected to the shift register,
   wherein at least one or more lines of the m clock supply lines and the n power supply lines are disposed in a first side direction of the shift register, and
   the other of the m lines of the clock supply lines and the n power supply lines are disposed in a second side direction of the shift register; and
   n and m are each natural numbers greater than 2.

2. The built-in gate driver of claim 1, wherein,
   the m clock supply lines are in the first side direction of the shift register, and the first side direction is an outer direction of the panel, and
   the n power supply lines are in the second side direction of the shift register, and the second side direction is adjacent to a display area of the panel.

3. The built-in gate driver of claim 1, wherein,
   the n power supply lines are in the first side direction of the shift register, and the first side direction is an outer direction of the panel, and
   the m clock supply lines are in the second side direction of the shift register, and the second side direction is adjacent to a display area of the panel.

4. The built-in gate driver of claim 1, wherein,
   the m clock supply lines and at least one of the n power supply lines are in the first side direction of the shift register, and the first side direction is an outer direction of the panel, and
   among the n power supply lines, power supply lines except a power supply line in the first side direction are in the second side direction of the shift register, and the second side direction is adjacent to a display area of the panel.

5. The built-in gate driver of claim 1, wherein,
   the n power supply lines and at least one of the m clock supply lines are in the second side direction of the shift register, and the second side direction is adjacent to a display area of the panel, and
   among the m clock supply lines, clock supply lines except the clock supply line in the second side direction are in the first side direction of the shift register, and the first side direction is an outer direction of the panel.

6. The built-in gate driver of claim 1, wherein,
   the n power supply lines and at least one of the m clock supply lines are in the first side direction of the shift register, and the first side direction is an outer direction of the panel, and
   among the m clock supply lines, clock supply lines except the clock supply line in the first side direction are in the second side direction of the shift register, and the second side direction is adjacent to a display area of the panel.

7. The built-in gate driver of claim 1, wherein,
   the m clock supply lines and at least one of the n power supply lines are in the second side direction of the shift register, and the second side direction is adjacent to a display area of the panel, and
   among the n power supply lines, power supply lines except a power supply line in the second side direction are in the first side direction of the shift register, and the first side direction is the outer direction of the panel.

8. A built-in gate driver comprising:
   a shift register provided in a non-display area of a panel, and including first to gth stages outputting a scan signal, each of the stages having at least two scan signal output units;
   a clock supply line part including m number of clock supply lines connected to the shift register; and
   a power supply line part configured including n number of power supply lines connected to the shift register,
   wherein,
   the at least two scan signal output units are connected to two or more gate lines which are disposed along one horizontal line of the panel, and output two or more scan signals to a plurality of gate lines; and
   the m clock supply lines or the n power supply lines are disposed in a first and a second side direction with respect to the shift register,
   the first side direction is an outer direction of the panel,
   the second side direction is adjacent to a display area of the panel, and
   the other of the m clock supply lines and the n power supply lines are disposed between the at least two scan signal output units of a stage of the stages.

9. The built-in gate driver of claim 1, wherein,
   each of the clock supply lines and the power supply lines comprises a main line along an outer direction of the panel and a branch line configured to electrically connect the main line to the shift register,
   a plurality of the branch lines are on the same layer as a layer of a gate electrode of a thin film transistor (TFT) formed in the stage, or on the same layer as a layer of a source electrode and drain electrode of the TFT, and the main line and the branch line are on different layers.

10. The built-in gate driver of claim 1, wherein a pull-up transistor, which is in the stage and outputs a pull-up signal of the scan signal, is in a coplanar type.

* * * * *